(12) United States Patent
Toyosawa

(10) Patent No.: US 6,509,631 B2
(45) Date of Patent: Jan. 21, 2003

(54) SEMICONDUCTOR DEVICE AND LIQUID CRYSTAL MODULE

(75) Inventor: Kenji Toyosawa, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 48 days.

(21) Appl. No.: 09/863,761

(22) Filed: May 24, 2001

(65) Prior Publication Data

US 2001/0054751 A1 Dec. 27, 2001

(30) Foreign Application Priority Data

May 26, 2000 (JP) ........................................ 2000-157247

(51) Int. Cl.[7] .............................................. H01L 29/72
(52) U.S. Cl. ...................... 257/668; 257/690; 257/692; 257/693
(58) Field of Search ................................ 257/668, 690, 257/692, 693

(56) References Cited

U.S. PATENT DOCUMENTS 5,126,824 A * 6/1992 Ueda ........................... 257/668

FOREIGN PATENT DOCUMENTS

JP 5-183102 A 7/1993

* cited by examiner

Primary Examiner—Edward Wojciechowicz
(74) Attorney, Agent, or Firm—Nixon & Vanderhye, P.C.

(57) ABSTRACT

A semiconductor device includes inner leads which project into a device hole of a polyimide base material having a wiring pattern on its surface and which are connected to the wiring pattern, and first and second semiconductor chips which are connected to the inner leads with their electrode bearing surfaces facing each other. The second semiconductor chip is bonded with the inner leads at a depression which is created as a result of bonding between the first semiconductor chip and the inner leads. As a result, much less time is required for the bonding of the semiconductor chip, an electrical component (such as a semiconductor chip), and the inner leads, and much less time also for manufacture, in addition to preventing wire breakage between the semiconductor chip, the electrical component, and the inner leads.

27 Claims, 14 Drawing Sheets

SEMICONDUCTOR DEVICE AND LIQUID CRYSTAL MODULE

FIELD OF THE INVENTION

The present invention relates to a semiconductor device in which a semiconductor chip or an electrical component such as a chip capacitor is stacked on another semiconductor chip having a different function, and to a liquid crystal module provided with such a semiconductor device.

BACKGROUND OF THE INVENTION

The conventionally available TCP (Tape Carrier Package) is an example of a semiconductor package for use in liquid crystal driving drivers.

For example, FIG. 11 and FIG. 12 show a TCP as a semiconductor device in which a semiconductor chip 112 is mounted in a device hole 121a which is formed at a predetermined position of a polyimide substrate 121 which is provided as an insulating base material tape.

The semiconductor chip 112 is electrically connected, via bumps 13 made of gold (Au), to inner leads 124 on the signal input side and inner leads 125 on the signal output side which project into the device hole 121a, on the opposite side of the surface of the polyimide substrate 121 where a conductive wiring (inner leads 124 and 125 and outer leads 126 and 127) is formed.

On the wiring pattern of the inner leads 124 and 125 and the outer leads 126 and 127 is formed an organic insulating film as a solder resist 122 to be patterned in a predetermined manner. Further, as shown in FIG. 12, surrounding the bonding portion between the semiconductor chip 112 and the inner leads 124 and 125 is a sealant 130 made of insulating resin.

Incidentally, with the wide spreading of portable phones in recent years, the TCP has been used as a semiconductor package for a driver (liquid crystal driver) for driving a liquid crystal used in portable phones. Such a liquid crystal driver for portable phones has been mass-produced by employing a semiconductor device which includes an SRAM in a single semiconductor chip, or a semiconductor device with a dual-function of a segment driver and a common driver.

However, a problem associated with installing the SRAM or the segment and common drivers in a single semiconductor chip is that the size of the entire semiconductor chip is increased. Further, when the semiconductor chip employs the common driver in particular, the voltage used in the common driver becomes relatively high, and this requires a high voltage resisting capability, which makes the application of a fine process difficult.

Further, as the portable phone liquid crystal module is made compatible with color display or fine-pitch display, the number of outputs is increased in the segment driver and the common driver. In this case, while the chip size can be reduced by a fine process on the SRAM side, manufacture by a fine process is impossible on the side of the common driver and the segment driver because they include a logic circuit. That is, the segment driver or common driver is preferably manufactured by a rough process of about 0.5 μm, and the driver size cannot be reduced.

Further, since the semiconductor chips are manufactured from a single wafer process, the semiconductor chips need to employ the rough process as a whole, which is suitable for manufacture of the common driver and the segment driver.

Thus, when a single semiconductor chip is to include the SRAM or the segment and common drivers, the chip size of the semiconductor chip is increased, resulting in increase in cost.

Further, driving of the liquid crystal module requires peripheral components, other than the liquid crystal driver, such as a chip capacitor. Such a peripheral component mounted on a carrier tape increases the size of the TCP itself, and, in turn, the size of the liquid crystal module.

Further, in order to mount the chip capacitor on the carrier tape, first, a solder-plated land is formed on the carrier tape, followed by forming a solder on the land by printing using a mount device. Then, the chip capacitor is placed on the solder for reflow soldering. Thus, mounting the chip capacitor on the carrier tape increases the number of assembly steps, and thus the cost.

In view of foregoing problems, for example, Japanese Unexamined Patent Publication No. 183102/1993 (Tokukaihei 5-183102) (published date: Jul. 23, 1993) discloses a semiconductor device in which two semiconductor chips are stacked on a carrier tape.

As shown in FIG. 13, the semiconductor device of the foregoing publication includes a flexible film 201 having first inner leads 204 and second inner leads 205 which are formed on one surface of the substrate and project into an opening 201a of the substrate with different lengths. This semiconductor device is manufactured by the process as shown in FIG. 14(a) through FIG. 14(d).

That is, as shown in FIG. 14(a) and FIG. 14(b), a first semiconductor chip 211 and the first inner leads 204 are electrically bonded with each other by gang bond, and as shown in FIG. 14(c) and FIG. 14(d), a second semiconductor chip 212 and the second inner leads 205 are electrically bonded with each other by a single point bond on the opposite side of the first semiconductor chip 211. The semiconductor device thus manufactured has a stacked structure of two semiconductor chips on a single plane.

In the semiconductor device having the foregoing structure, the stacked semiconductor chips can be adapted to have different functions, for example, by adopting the function of the liquid crystal driving segment and common drivers for one semiconductor chip and the function of the SRAM for the other semiconductor chip. This makes it possible to reduce the chip area compared with the case where the two functions are included in a single semiconductor chip.

However, in the semiconductor device of the foregoing publication, as show in FIG. 14(c), the bonding between the second semiconductor device 212 and the second inner leads 205 are carried out on the side of the first semiconductor chip 211 which is bonded with the first inner leads 204. Thus, considering a possible damage or other adverse effects on the first semiconductor chip 211, the bonding has to be made by a single point bond. This increases the time required for bonding the second semiconductor chip 212 and the second inner leads 205. As a result, manufacturing time of the semiconductor device is greatly increased.

Further, as shown in FIG. 12, the inner leads 124 and 125 bonded with the semiconductor chip 112 are usually bent to have a function of a dumper against an external force which acts on the semiconductor chip 112, so as to prevent wire breakage between the inner leads 124 and 125 and the semiconductor chip 112.

In contrast, in the semiconductor device of the foregoing publication, the first semiconductor chip 211 and the second semiconductor chip 212 are face to face and are connected to the first inner leads 204 and the second inner leads 205 of different lengths. Further, the first inner leads 204 and the second inner leads 205 are held nearly horizontally with respect to the wiring bearing surface of the flexible film 201. That is, the inner leads cannot have the dumping function. Thus, when an external force acts on the semiconductor chip to pull it, wire breakage easily occurs between the semiconductor chips and the inner leads.

Thus, when the semiconductor device of the foregoing publication is applied to the liquid crystal module, while the size of the device can be reduced compared with the semiconductor device having two functions (segment driver and common driver) in a single semiconductor chip, reliability of the liquid crystal module suffers by the susceptibility of wire breakage between the semiconductor chips and the inner leads.

SUMMARY OF THE INVENTION

The present invention was made in view of the foregoing problems, and it is an object of the present invention to provide a semiconductor device which requires a notably less manufacturing time by bonding a semiconductor chip or an electrical component (such as a semiconductor chip) and inner leads in a shorter period of time, and which is less susceptible to wire breakage between the semiconductor chip or the electrical component and the inner leads, and also to provide a small and highly reliable liquid crystal module using such a semiconductor device as a liquid crystal driving driver.

In order to achieve the foregoing object, a semiconductor device according to the present invention includes a carrier tape composed of a base material with a wiring pattern; inner leads which project into an opening of the carrier tape and which are connected to the wiring pattern; a semiconductor chip which is bonded with the inner leads at the opening; and an electrical component which is bonded with the inner leads on the opposite side of a surface of the semiconductor chip bonded with the inner leads, wherein the electrical component is bonded with the inner leads at a depression which is created as a result of bonding between the semiconductor chip and the inner leads.

With this arrangement, since the depression is formed as a result of bonding between the semiconductor chip and the inner leads, the inner leads have bent portions.

In this way, even when the semiconductor chip and the electrical component are pulled by an external force, the bent portions of the inner leads act as a dumber to prevent wire breakage between the semiconductor chip and the inner leads.

Further, since the electrical component stacked on the semiconductor device is bonded with the inner leads at the depression which is created as a result of bonding between the semiconductor chip and the inner leads, the semiconductor device can be made thinner than the case where the semiconductor chip and the electrical component are simply stacked.

As a result, reliability of the semiconductor device can be improved and the size thereof can be reduced.

Further, when the electrical component stacked on the semiconductor device is another semiconductor chip which has a different function from that of the semiconductor chip, one of the semiconductor chip can be adapted to have a function of a liquid crystal driving segment driver and the other semiconductor chip a function of a liquid crystal driving common driver, so as to be applicable to a liquid crystal module for use in liquid crystal display devices.

In this case, since wire breakage between the semiconductor chip and the electrical component is prevented in the foregoing semiconductor device, the semiconductor device can be appreciably used as a liquid crystal driving driver to provide a small and highly reliable liquid crystal module.

For a fuller understanding of the nature and advantages of the invention, reference should be made to the ensuing detailed description taken in conjunction with the accompanying drawings.

DESCRIPTION OF THE EMBODIMENTS

The following will describe one embodiment of the present invention with reference to the attached drawings.

Figure 1:
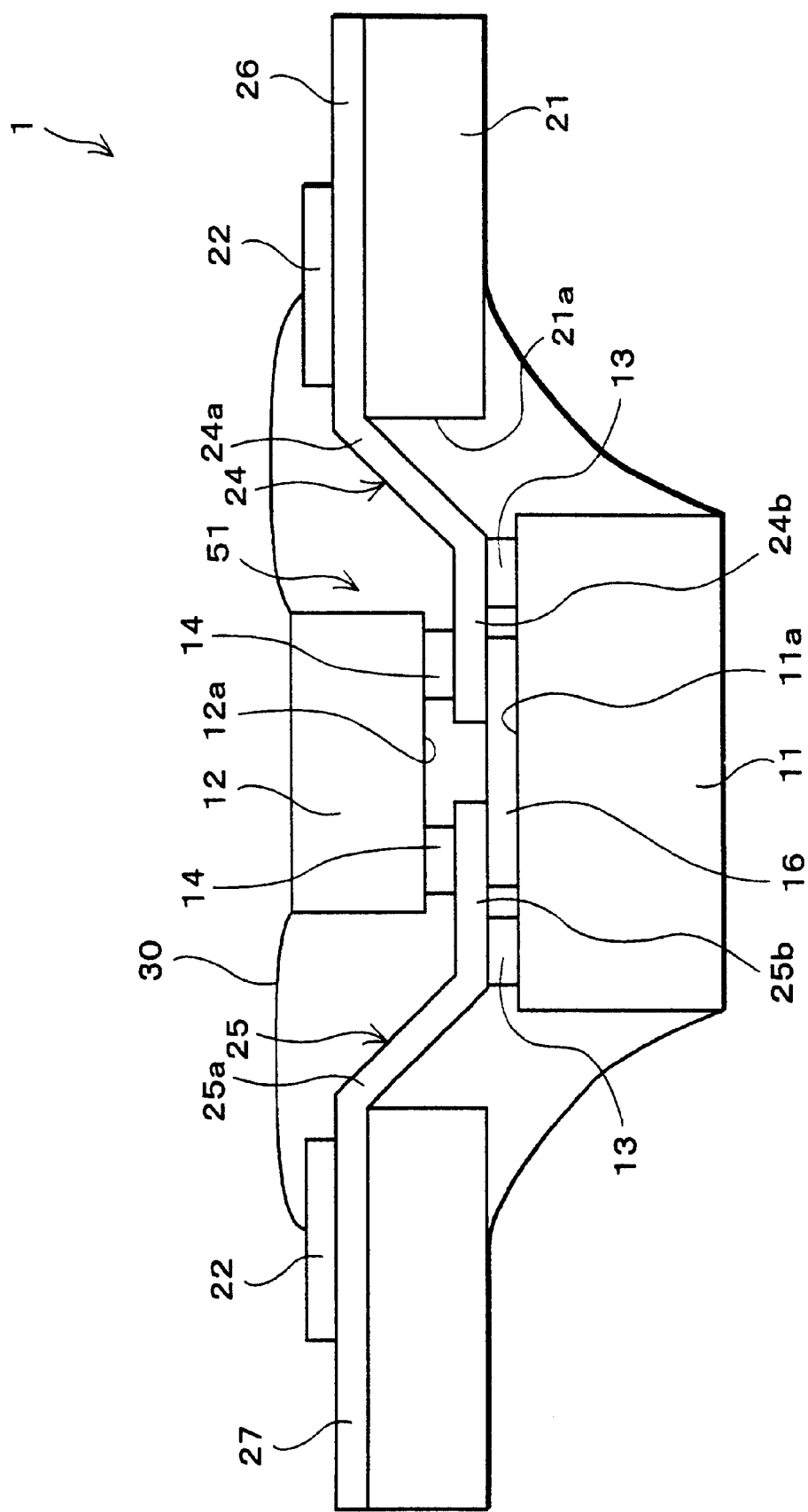
FIG. 1 is a cross sectional view schematically showing a semiconductor device of the present invention.
Figure 2:
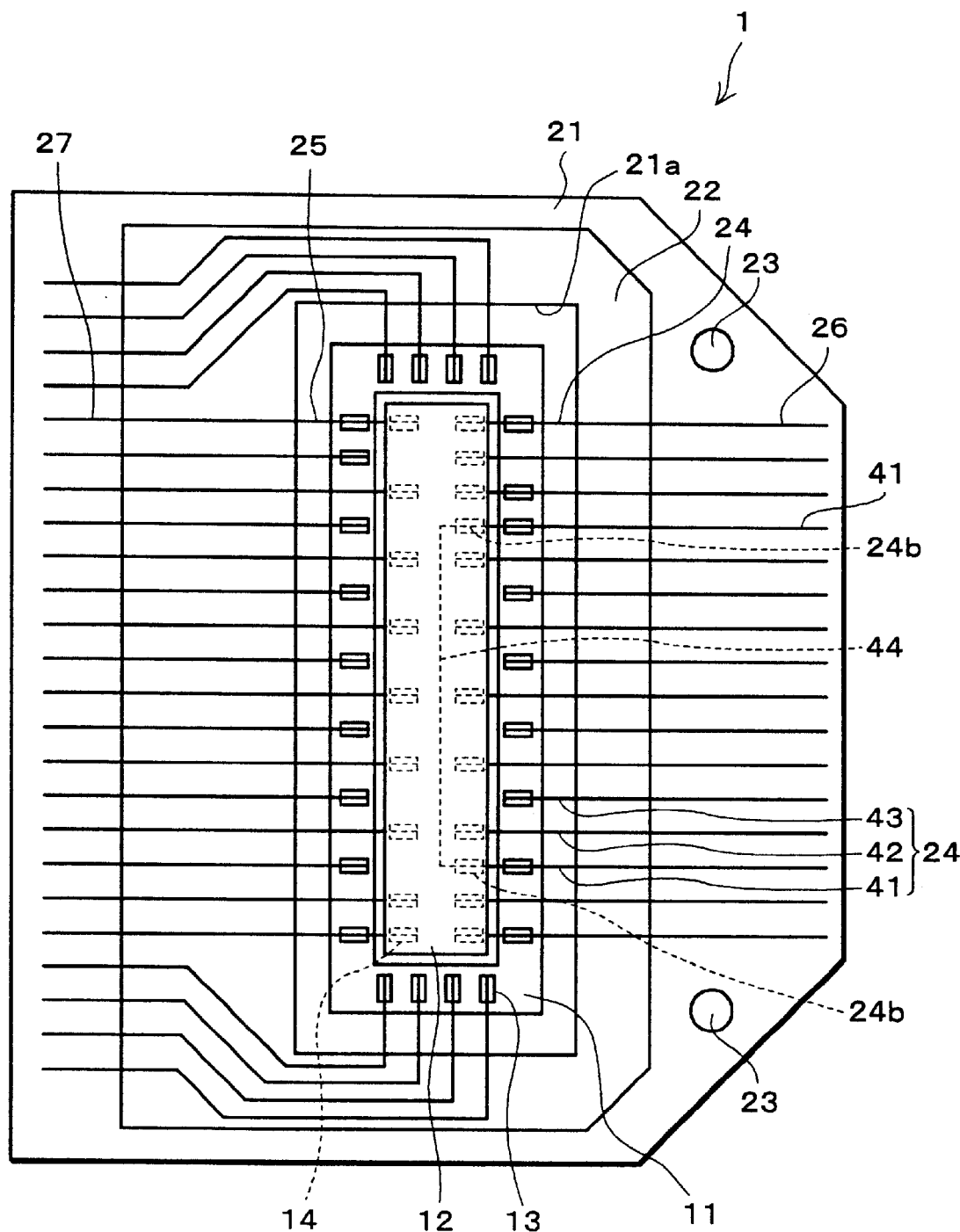
FIG. 2 is a schematic plan view of the semiconductor device of FIG. 1.

The following explanations are based on a TCP (Tape Carrier Package) semiconductor device 1, which is a semiconductor device according to the present embodiment, having an arrangement as shown in FIG. 1 and FIG. 2, wherein a first semiconductor chip 1 and a second semiconductor chip 2 are stacked with their electrode bearing surfaces 11a and 12a facing each other in a device hole (opening) 21a formed at a predetermined position of a polyimide base material 21, which is a carrier tape made of an organic material. Note that, the explanations of the present embodiment will be given through the case where the electrical component stacked on a semiconductor chip (first semiconductor chip 11) is a semiconductor chip (second semiconductor chip 12).

On the electrode bearing surface 11a of the first semiconductor chip 11 are formed electrodes (not shown) which are patterned with aluminum, bumps 13 made of gold (Au) which are connected to terminal sections of the electrodes, and a protecting film 16 made of an organic insulator for protecting the electrodes except where the bumps 13 are formed.

The second semiconductor chip 12 is smaller in width than the first semiconductor chip 11, and the electrode bearing surface 12a includes, as with the first semiconductor chip 11, electrodes (not shown) which are patterned with aluminum, and bumps 14 made of gold (Au) which are connected to terminal sections of the electrodes.

The bumps 13 and 14 are electrically connected to inner leads 24 and 25 which are formed on the polyimide base material 21 (described later).

The polyimide base material 21 has on its surface the inner lead 24 and an outer lead 26 of the signal input side, and the inner lead 25 and an outer lead 27 of the signal output side, which are provided as a wiring pattern. The inner lead 24 and the inner lead 25 are formed so as to project into the device hole 21a of the polyimide base material 21.

Further, on an electrode bearing surface of the polyimide base material 21 is formed a solder resist 22 as an organic insulating film for covering a portion in the vicinity of a boundary between the inner lead 24 and the outer lead 26 and a boundary between the inner lead 25 and the outer lead 27. This allows the wiring pattern of the inner leads 24 and 25 and the outer leads 26 and 27 to be supported on the polyimide base material 21 in close contact therewith.

The inner leads 24 and 25 are bent on a predetermined angle to be depressed on the opposite side of the surface of the polyimide base material 21 where the wiring pattern is formed. This forms bent portions 24a and 25a. Further, the bumps 13 of the first semiconductor chip 11 are connected to front end portions 24b and 25b of the bent portions 24a and 25a on the opposite side of the surface of the polyimide base material 21 on which the wiring pattern is formed. The bumps 14 of the second semiconductor chip 12 are connected to the tips of the front end portions 24b and 25b on the side opposite the wiring bearing surface 11a of the first semiconductor chip 11.

That is, the inner leads 24 and 25 are bent by being pressed inward into the device hole 21a by a bonding tool (not shown) and toward the first semiconductor chip 11, which is bonded first.

Thus, the bent portions 24a and 25a and the front end portions 24b and 25b, which are formed by bending the inner leads 24 and 25, make up a depression 51 in the device hole 21a of the polyimide base material 21, and the second semiconductor chip 12 is bonded in position in the depression 51.

In this manner, in the semiconductor device according to the present embodiment, when stacking two semiconductor chips, one of the semiconductor chips is bonded in position in the depression of the device hole, which is created when the inner leads are bonded with the other semiconductor chip. Thus, the thickness of the entire semiconductor device can be made thinner than the case where the semiconductor chips are simply stacked.

Further, by shaving the respective other sides of the electrode bearing surfaces 11a and 12a of the first semiconductor chip 11 and the second semiconductor chip 12 by polishing, the semiconductor device 1 can be made even thinner. In this case, by adjusting the thicknesses of the respective chips so that the thickness of the entire semiconductor device falls in a range of not less than 40 $\mu$m to not more than 400 $\mu$m, it is possible to obtain a semiconductor device having substantially the same thickness as that composed of a single semiconductor chip without polishing.

Figure 12:
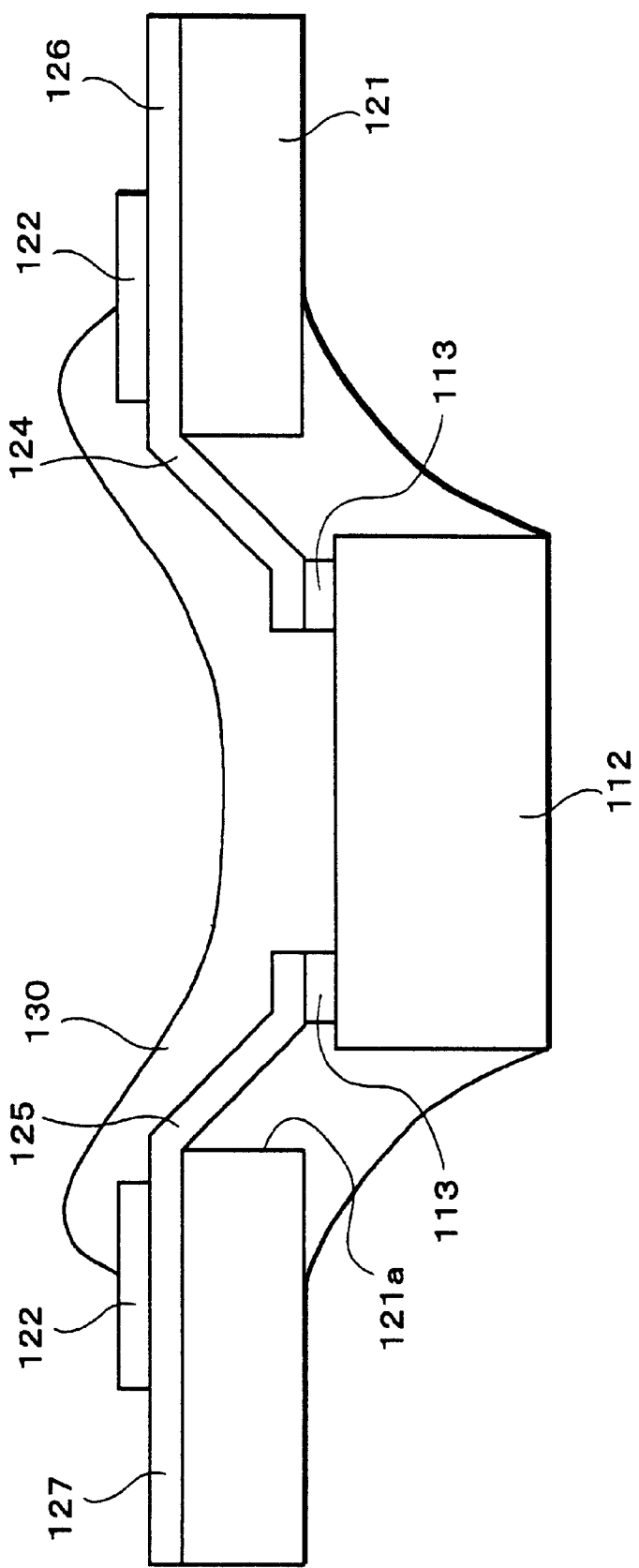
FIG. 12 is a cross sectional view of the semiconductor device of FIG. 11, taken along the line X—X.
Figure 13:
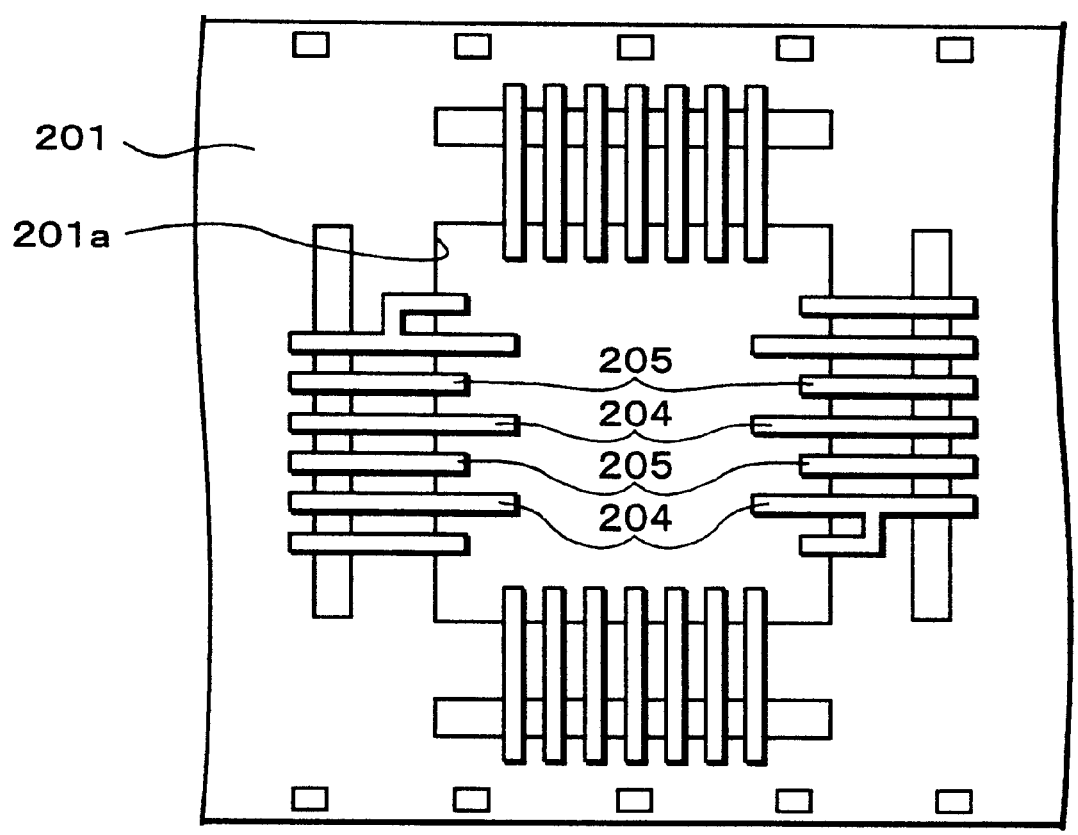
FIG. 13 is a schematic plan view of a flexible film making up a conventional semiconductor device.
Figure 14:
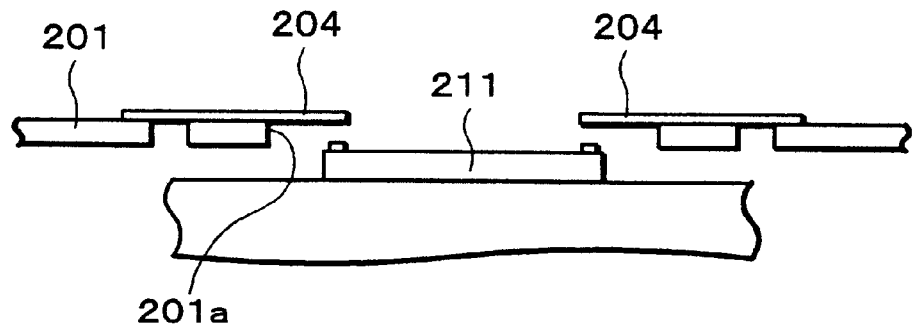
FIG. 14(a) through FIG. 14(d) are explanatory drawings showing manufacturing steps of the semiconductor device using the flexible film shown in FIG. 13.
Figure 14:
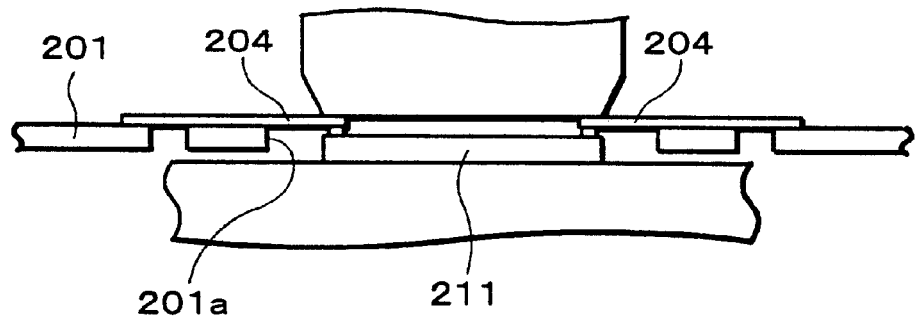
Figure 14:
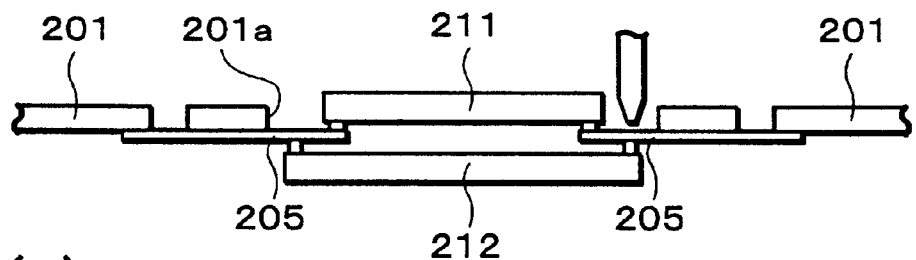
Figure 14:
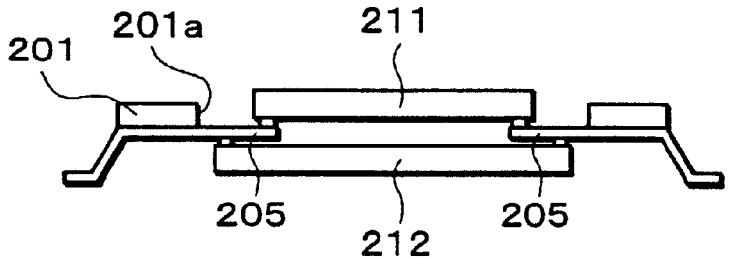

While the first semiconductor chip 11 and the second semiconductor chip 12 are stacked in the device hole 21a of the polyimide base material 21, a sealant 30 is formed so as to close the device hole 21a and to cover the electrode bearing surfaces of the first and second semiconductor chips 11 and 12. Here, even through the surfaces on the other sides of the electrode bearing surfaces of the first and second semiconductor chips 11 and 12 may be covered with the sealant 30 as well, the thickness of the semiconductor device can be made thinner without doing so, for example, as in the structure shown in FIG. 12 which was explained in the BACKGROUND OF THE INVENTION section.

The front end portions 24b and 25b of the inner leads 24 and 25 are formed so that they project further inward past the points of bonding with the bumps 13 of the first semiconductor chip 11. Here, the front end portions 24b and 25b of the inner leads 24 and 25 are formed so that they approach but do not touch each other. Further, the front end portions 24b and 25b are formed so that portions more toward the tips are disposed on the protecting film 16 on the electrode bearing surface 11a of the first semiconductor chip 11.

Further, the bumps 14 of the second semiconductor chip 12 are connected to the front end portions 24b and 25b of the inner leads 24 and 25 on the inner side of the points of bonding between the bumps 13 and the front end portions 24b and 25b of the inner leads 24 and 25.

That is, the bumps 14 of the second semiconductor chip 12 are connected to the front end portions 24b and 25b of the inner leads 24 and 15, which are disposed on the insulating film 16. In this way, when bonding the second semiconductor chip 12 with the inner leads 24 and 25, the bonding can be made by gang bond (one-time bond), because the protecting film 16 acts as a dumper for absorbing a pressure applied on the second semiconductor chip 12 against the first semiconductor chip 11. The first semiconductor chip 11 is bonded with the inner leads 24 and 25 by gang bond before the second semiconductor chip 12.

Thus, in manufacture of the semiconductor device with the two stacked semiconductor chips, both the first semiconductor chip 11 and the second semiconductor chip 12 can be bonded with the inner leads 24 and 25 by gang bond, thus requiring much less time for bonding the two semiconductor chips, compared with a conventional bonding method in which the first semiconductor chip is bonded with the inner leads by gang bond and the second semiconductor chip is bonded with the inner leads by single point bond.

The following describes a manufacturing process of the semiconductor device.

First, the first semiconductor chip 11 and the second semiconductor chip 12 are made. The first semiconductor chip 11 is formed to include a segment driver and a common driver, which are provided as liquid crystal driving drivers, and the second semiconductor chip 12 is formed to include an SRAM and a controller.

The first semiconductor chip 11 has 312 outputs, and a chip size of 18 mm×2.0 mm. The first semiconductor chip 11 is processed at 0.65 $\mu$m for manufacture, with the bump height of 10 $\mu$m and the minimum wire pitch of 50 $\mu$m.

The second semiconductor chip 12, on the other hand, has 312 outputs, and a chip size of 17 mm×1.2 mm. Also, the second semiconductor chip 12 is processed at 0.35 $\mu$m for manufacture.

Thereafter, the first semiconductor chip 11 and the second semiconductor chip 12 are stacked in the device hole 21a of the polyimide base material 21. Here, the rear surface (surface on the other side of the electrode bearing surface 11a or 12a) of each semiconductor chip is polished to the thickness of 400 μm. Here, omission of polishing does not pose any serious problem, but by polishing the rear surfaces of the two semiconductor chips, the total thickness of the semiconductor device can be made 1.1 mm (maximum), which is substantially the same as the total thickness of a semiconductor device composed of a single chip.

The first semiconductor chip 11 and the second semiconductor chip 12 are stacked in such a manner that the first semiconductor chip 11 is first bonded with the inner leads 24 and 25, and then the second semiconductor chip 12 is bonded with the inner leads 24 and 25.

Figure 3:
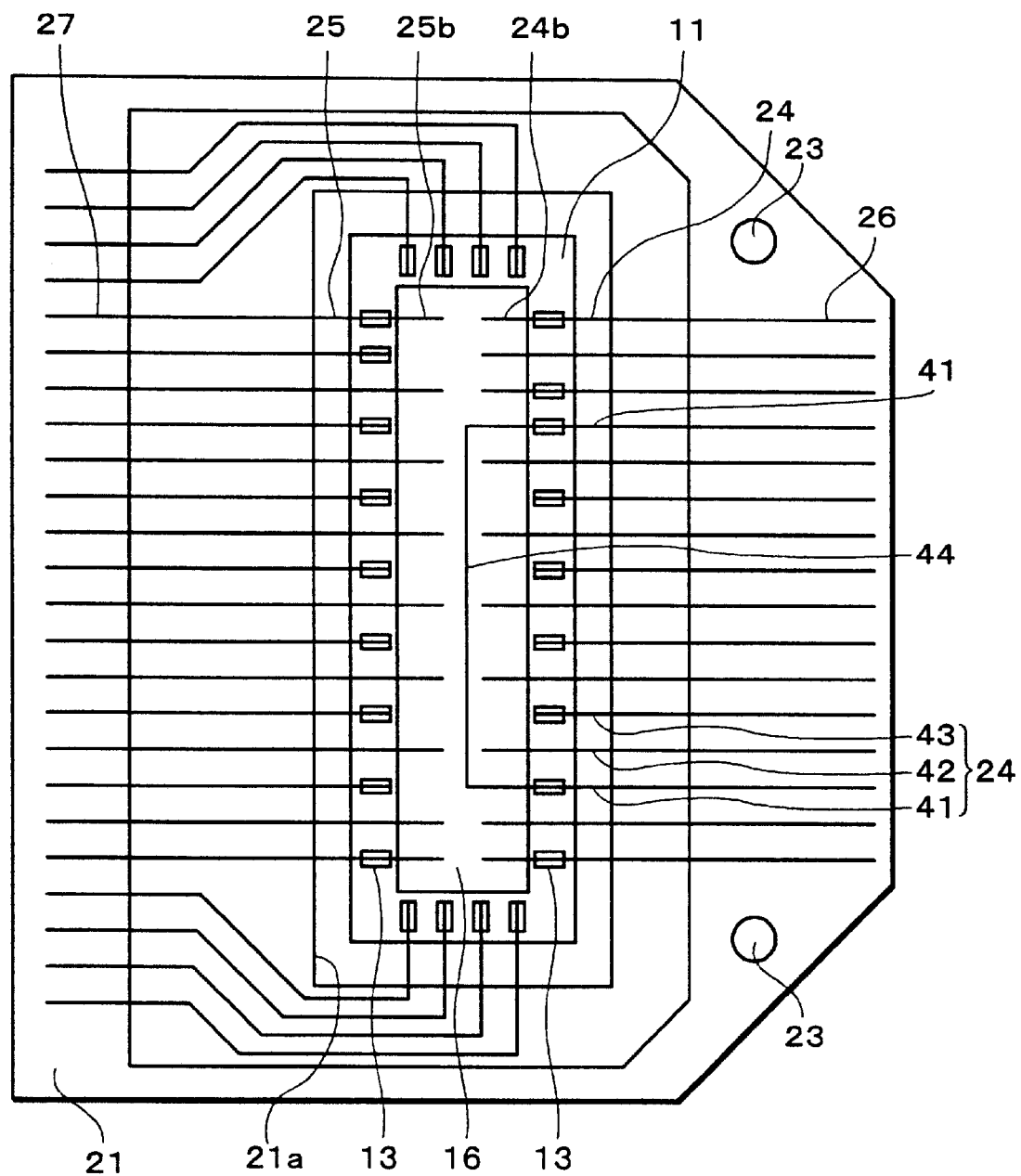
FIG. 3 is an explanatory drawing showing the semiconductor device of FIG. 2 in a state before a second semiconductor chip is stacked thereon.

That is, on the surface (electrode bearing surface 11a) of the first semiconductor chip 11 is formed, as shown in FIG. 3, the protecting film 16 made of an organic material such as polyimide in the thickness of 5 μm. The protecting film 16 is evenly formed on the electrode bearing surface 11a on the inner side of the bumps 13, avoiding the bumps 13.

Then, as shown in FIG. 3, inner bonding of the first semiconductor chip 11 is carried out in the device hole 21a of the polyimide base material 21.

The inner bonding is performed using a common inner bonder. That is, the first semiconductor chip 11 attached to a dicing tape is directly set on the inner bonder and is placed on a bonding stage by making the first semiconductor chip 11 adhere to a collet by lifting the first semiconductor chip 11 from the rear surface using a pin.

Then, the first semiconductor chip 11 is aligned using alignment holes 23 of the polyimide base material 21. That is, the first semiconductor chip 11 placed on the bonding stage is moved to a proper position, thus aligning the inner leads 24 and 25 of the polyimide base material 21 with respect to the bumps 13 of the first semiconductor chip 13.

Here, the bumps 13 and the inner leads 24 and 25 are bonded with each other by pressing and bending the inner leads 24 and 25 using a bonding tool while the polyimide base material 21 and the first semiconductor chip 11 are fixed. As a result, the inner leads 24 and 25 come to have the bent portions 24a and 25a, as shown in FIG. 1. The length of bent is usually around 90 μm to 120 μm.

The front end portions 24a and 25a of the inner leads 24 and 25 project past the bumps 13, taking into consideration the position of the protecting film 16 which exists on the electrode bearing surface 11a of the first semiconductor chip 11. That is, the front end portions 24b and 25b toward the tips are disposed on the protecting film 16. Note that, the front end portions 24b and 25b are set to project to the extent where the distance from the points of bonding with the bumps 13 is at least 30 μm, and the front end portion 24b or 25b does not touch the bump 13 of the opposite side.

The inner leads 24 and 25 includes, as shown in FIG. 2, first inner leads 41 which are bonded with the bumps 13 of the first semiconductor chip 11 and the bumps 14 of the second semiconductor chip 12, second inner leads 42 which are bonded only with the bumps 14 of the second semiconductor chip 14, and third inner leads 43 which are bonded only with the bumps 13 of the first semiconductor chip 11.

Further, front end portions 24b of two of the first inner leads 41 on the side of the inner lead 24 are electrically connected to each other by a lead 44, so as to prevent a voltage drop.

As described, in the inner bonding of the first semiconductor chip 11 with the inner leads 24 and 25, the protecting film 16 formed on the surface of the first semiconductor chip 11 provides a cushioning function, and therefore the first semiconductor chip 11 will not be damaged.

The inner leads 24 and 25 are copper leads which are tin-plated to the thickness of 0.5 μm. Here, the copper and tin make up an alloy layer, and thus the thickness of pure tin on the surface of the inner leads 24 and 25 is about 0.15 μm.

Alternatively, the inner leads 24 and 25 may be plated with gold, instead of tin. In this case, an Au-Au bond is made between the inner leads 24 and 25, and the bumps 13, which is advantageous in increasing the bond strength. Further, in the case of gold plating, there will be no alloy layer of gold and tin, even when heat is applied in the first bonding between the first semiconductor chip 11 and the bumps 13, thus ensuring the second bonding between the second semiconductor chip 12 and the bumps 14.

Note that, the present embodiment employs inexpensive tin-plating, because bonding can be made, even when the inner leads 24 and 25 are tin-plated, by increasing the thickness of the plated tin to some extent. The plated tin is required to have a certain thickness, or else an eutectic alloy of gold and tin will not be formed and bonding fails. Therefore, the thickness of the plated tin is preferably set to a thickness which can form the eutectic alloy. Further, a thickness of the plated tin that is too thick forms the eutectic alloy in excess, and poses the problem of shorting between bumps.

Thereafter, the second semiconductor chip 12 is inner-bonded, while the inner bonding of the first semiconductor chip 11 is intact in the device hole 21a of the polyimide base material 21 (FIG. 3).

In this inner bonding, a flip-chip bonder is used. The flip-chip bonder is used to align the inner leads 24 and 25 on the first semiconductor chip 11 which was bonded first, so as to carry out thermo-compression of the second semiconductor chip 12 adhering on the bonding tool, with respect to the inner leads 24 and 25. Here, the applied force per bump is 294 mN (30 gf), and the bonding time is 3 seconds, and the applied temperature is 400° C.

Here, the second semiconductor chip 12 which is bonded later also has the Au-Sn bond for bonding the bumps 14 and the inner leads 24 and 25, but assembly is also possible even when the bonding face has an NCP (non-conductive paste) made of epoxy, or an ACP (anisotropic conductive paste) which is prepared by mixing Au-plated particles with a particle size of about 3 μm in the NCP. In this case, the NCP is formed by embedding by potting while the bonding between the first semiconductor chip 11 and the inner leads 24 and 25 is intact. Further, in this case, by embedding the NCP around the device hole 21a of the polyimide base material 21 and over the entire first semiconductor chip 11, the sealant 30 will not be required.

Figure 4:
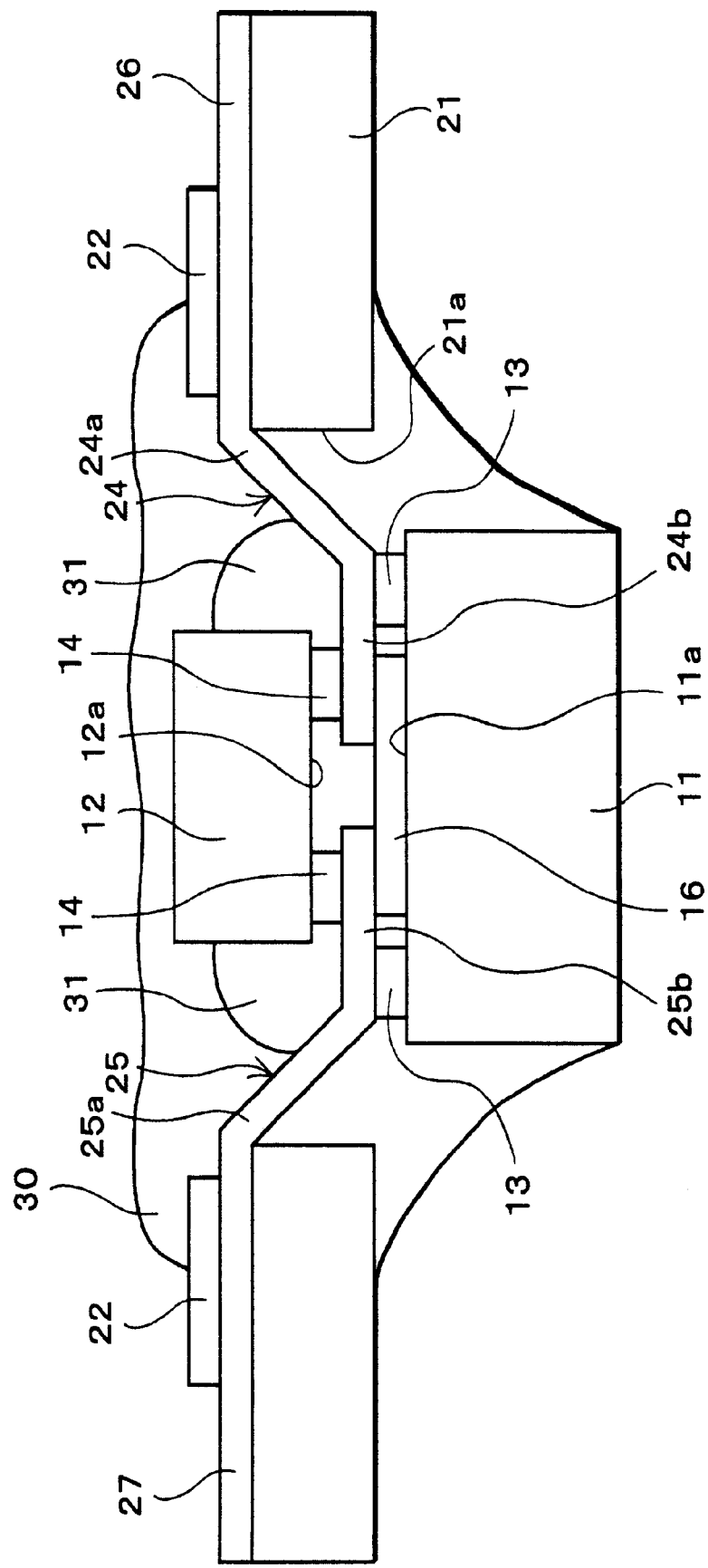
FIG. 4 is a cross sectional view schematically showing another semiconductor device of the present invention.

That is, as shown in FIG. 4, an NCP 31 may be formed above the first semiconductor chip 11. In this case, the second semiconductor chip 12 is bonded with the inner leads 24 and 25 by the flip-chip bonder, and the bonding is made at the applied temperature of 200° C. and the bonding time of 2 seconds.

In either case, a liquid resin made of epoxy is embedded on the side surfaces of the second semiconductor chip 12 from the rear side thereof after bonding the second semiconductor chip 12, which is the second semiconductor chip. Then, the liquid resin thus embedded is pre-cured at a temperature of 125° C. for 20 minutes, and then post-cured at a temperature of 125° C. for 3 hours.

The foregoing semiconductor device has a stacked structure of semiconductor chips, which increases the thickness.

This increase in thickness can be suppressed by using semiconductor chips which have been polished on their rear surfaces to a thickness in a range of 40 μm to 400 μm.

Figure 5:
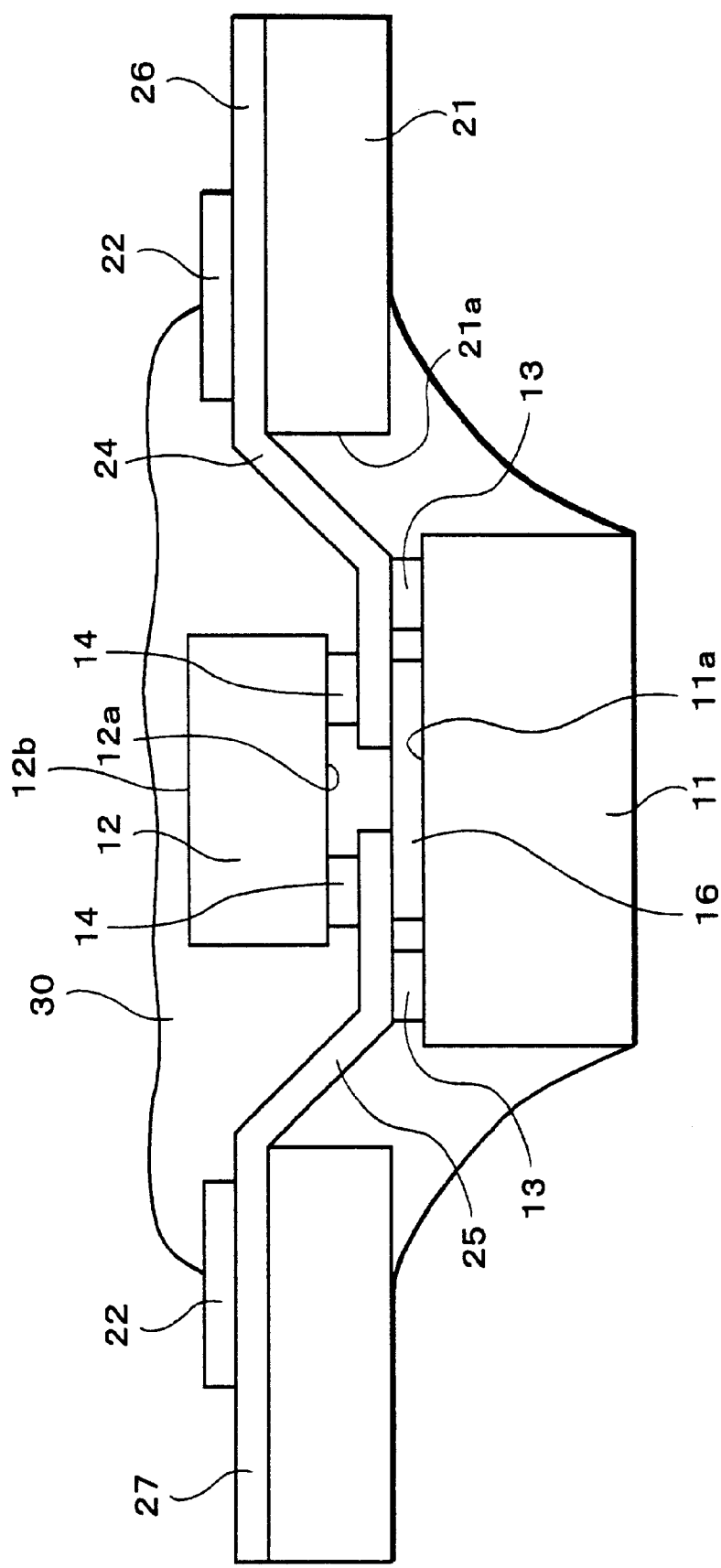
FIG. 5 is a cross sectional view schematically showing yet another semiconductor device of the present invention.

Further, as shown in FIG. 5, a rear surface 12b of the second semiconductor chip 12 may be covered with a podding resin (sealant 30).

The foregoing described the case where the semiconductor device has the structure wherein the first semiconductor chip 11 and the second semiconductor chip 12 have different chip sizes, and the points of bonding between the bumps 13 of the first semiconductor chip 11 and the inner leads 24 and 25 are completely offset from the points of bonding between the bumps 14 of the second semiconductor chip 12 and the inner leads 24 and 25. The following describes the case, as shown in FIG. 6, where the first semiconductor chip 11 and the second semiconductor chip 12 have the same chip size, and the points of bonding between the bumps 13 of the first semiconductor chip 11 and the inner leads 24 and 25 completely coincide with the points of bonding between the bumps 14 of the second semiconductor chip 12 and the inner leads 24 and 25.

Figure 6:
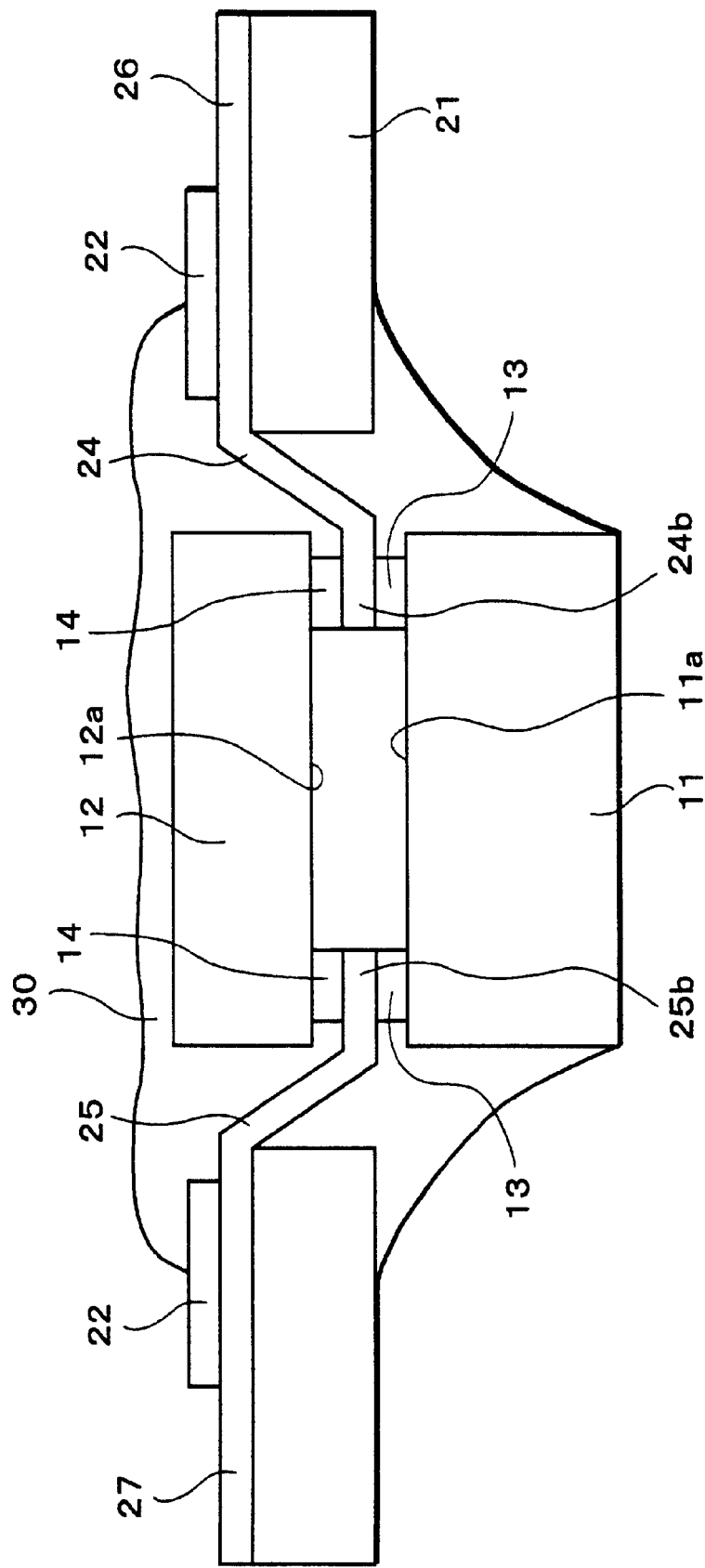
FIG. 6 is a cross sectional view schematically showing still another semiconductor device of the present invention.

In the semiconductor device as shown in FIG. 6, the points of bonding between the bumps 13 of the first semiconductor chip 11 and the inner leads 24 and 25 completely coincide with the points of bonding between the bumps 14 of the second semiconductor chip 12 and the inner leads 24 and 25. Therefore, the inner leads 24 and 25 do not come in contact with the electrode bearing surface 11a of the first semiconductor chip 11 or the electrode bearing surface 12a of the second semiconductor chip 12. Thus, the protecting film 16 is not required.

Figure 7:
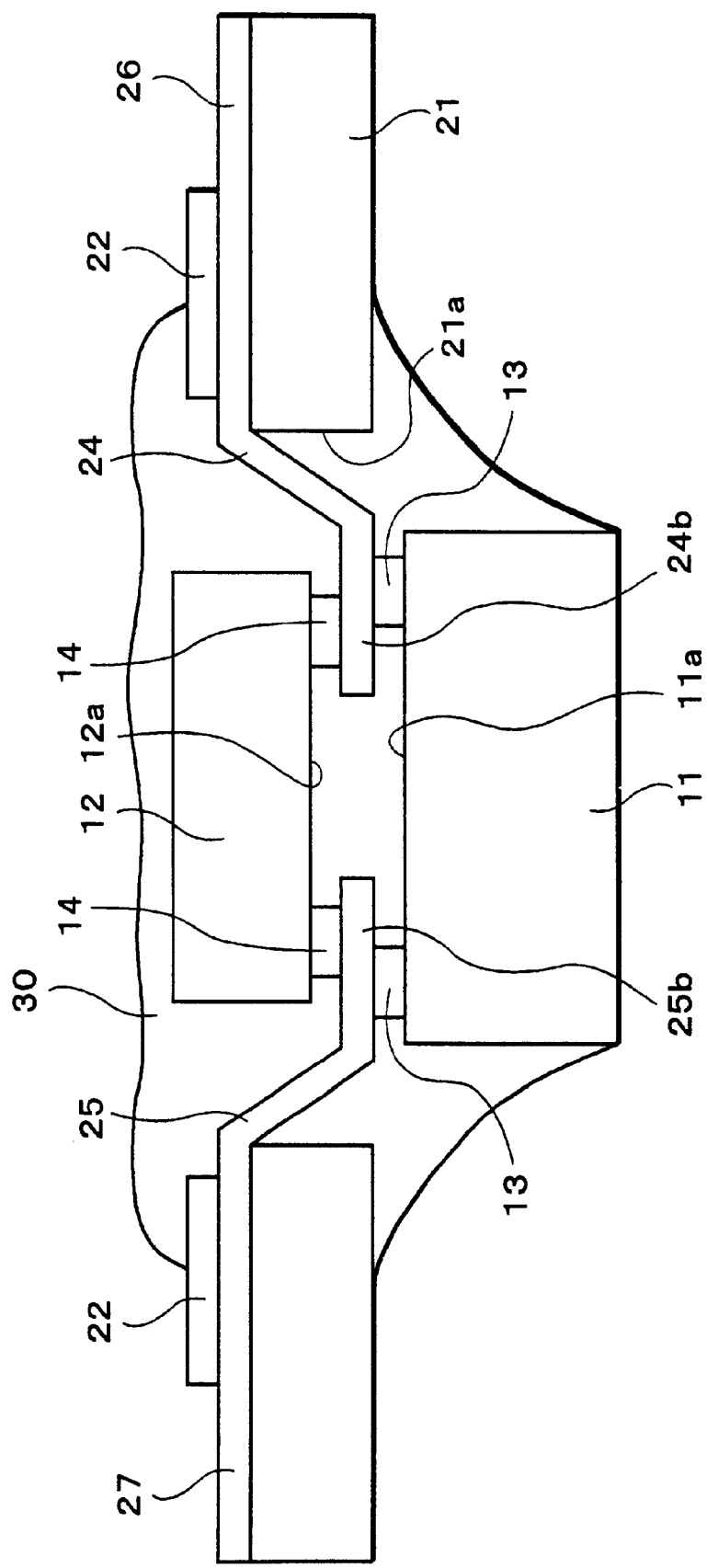
FIG. 7 is a cross sectional view schematically showing yet another semiconductor device of the present invention.

Further, even when the first semiconductor chip 11 and the second semiconductor chip 12 have different chip sizes, as shown in FIG. 7, by the arrangement where the points of bonding between the bumps 13 of the first semiconductor chip 11 and the inner leads 24 and 25 partially overlap with the points of bonding between the bumps 14 of the second semiconductor chip 14 and the inner leads 24 and 25, the protecting film 16 will not be required on the first semiconductor chip 11 as shown in FIG. 1. This is because such an arrangement prevents the inner leads 24 and 25 from coming into contact with the electrode bearing surface 11a of the first semiconductor chip 11 or the electrode bearing surface 12a of the second semiconductor chip 12.

The foregoing described the case where the first semiconductor chip 11 and the second semiconductor chip 12 are stacked; however, other electrical components, such as a chip capacitor, may be stacked instead of the second semiconductor chip 12. The following describes such a case where a chip capacitor is stacked instead of the second semiconductor chip 12, for example.

Figure 8:
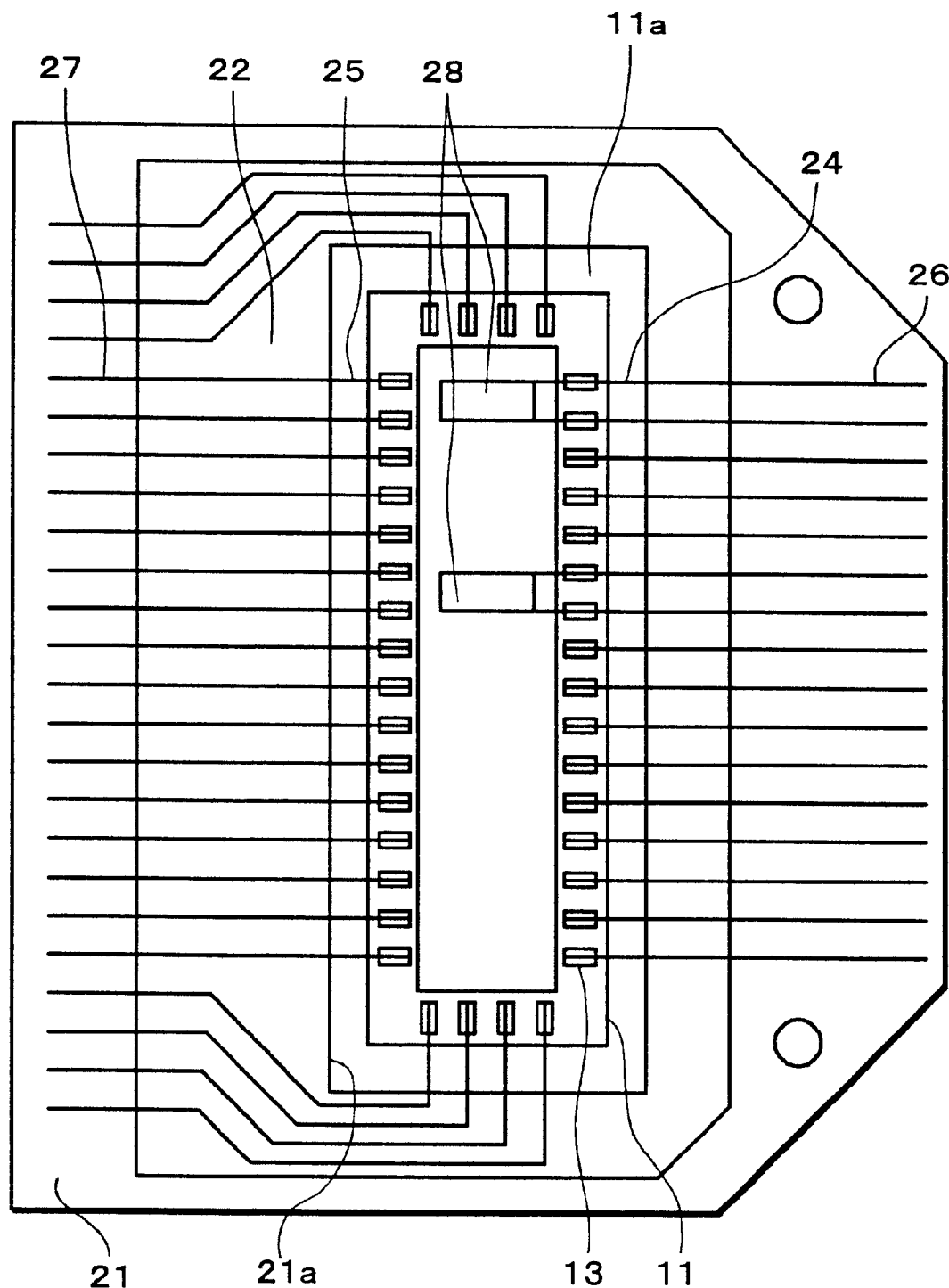
FIG. 8 is an explanatory drawing of still another semiconductor device of the present invention, showing a state in which a chip capacitor, as an electrical component, is stacked thereon.

First, as shown in FIG. 8, inner leads 24 are extended above the electrode bearing surface 11a of the first semiconductor chip 11 to form lands 28 thereon, and a solder is printed on the lands 28.

Figure 9:
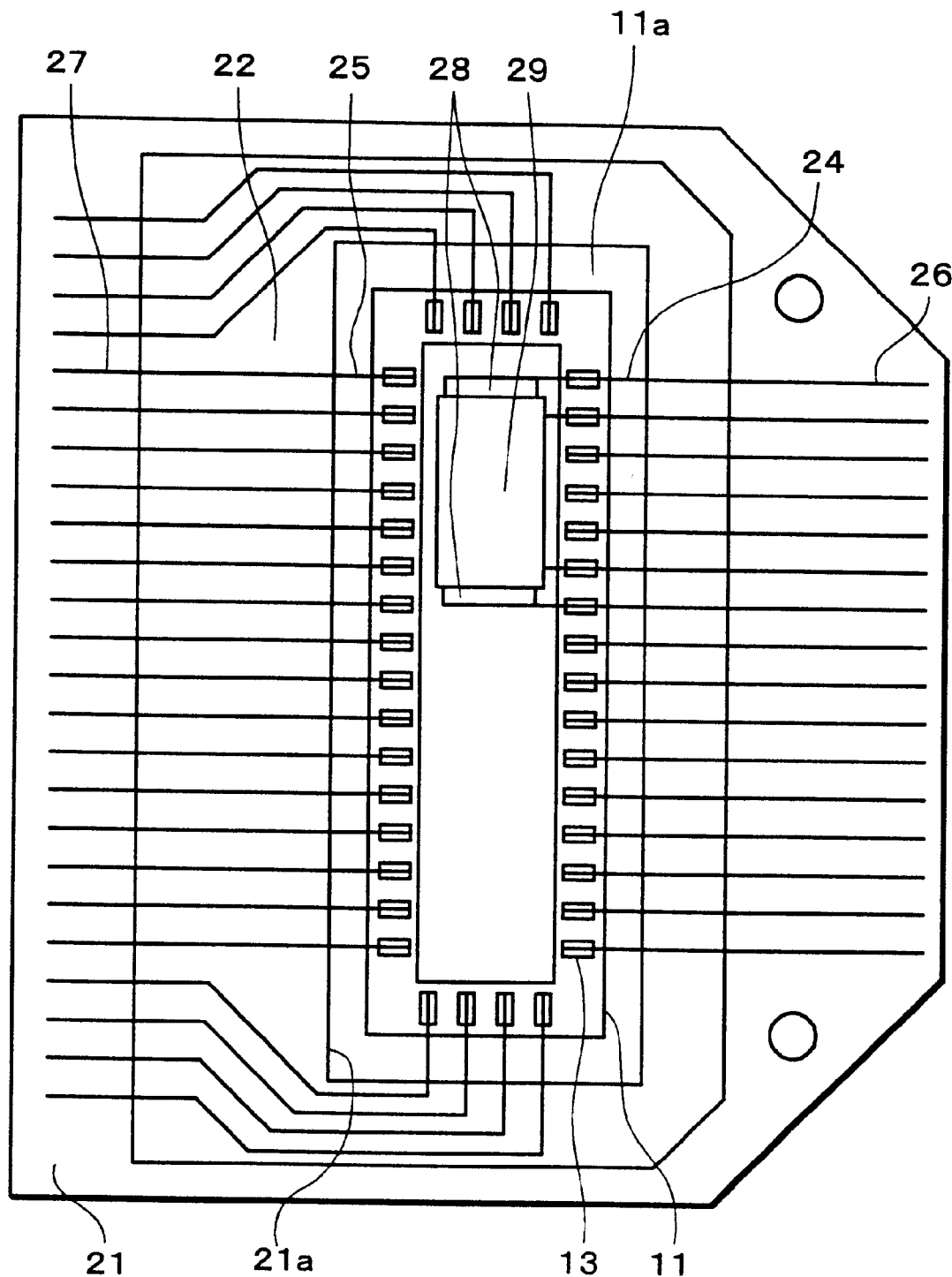
FIG. 9 is an explanatory drawing of yet another semiconductor device of the present invention, showing a state in which a chip capacitor, as an electrical component, is stacked thereon.

Then, as shown in FIG. 9, a chip capacitor 29 is placed on the lands 28 with the printed solder so as to carry out reflow soldering, thus manufacturing a semiconductor device having the chip capacitor 29 as an electrical component other than the second semiconductor chip 12, on the electrode bearing surface 11a of the first semiconductor chip 11.

Note that, depending on the size of the chip capacitor 29, two or more chip capacitors may be provided on the electrode bearing surface 11a of the first semiconductor chip 11.

Further, in the semiconductor device 1 as shown in FIG. 1, the first semiconductor chip 11 and the second semiconductor chip 12 may have different functions. For example, when the semiconductor device 1 is for use in a liquid crystal module, the first semiconductor chip may have a function of a liquid crystal driving segment driver, and the second semiconductor chip 12 may have a function of a liquid crystal driving common driver.

Figure 10:
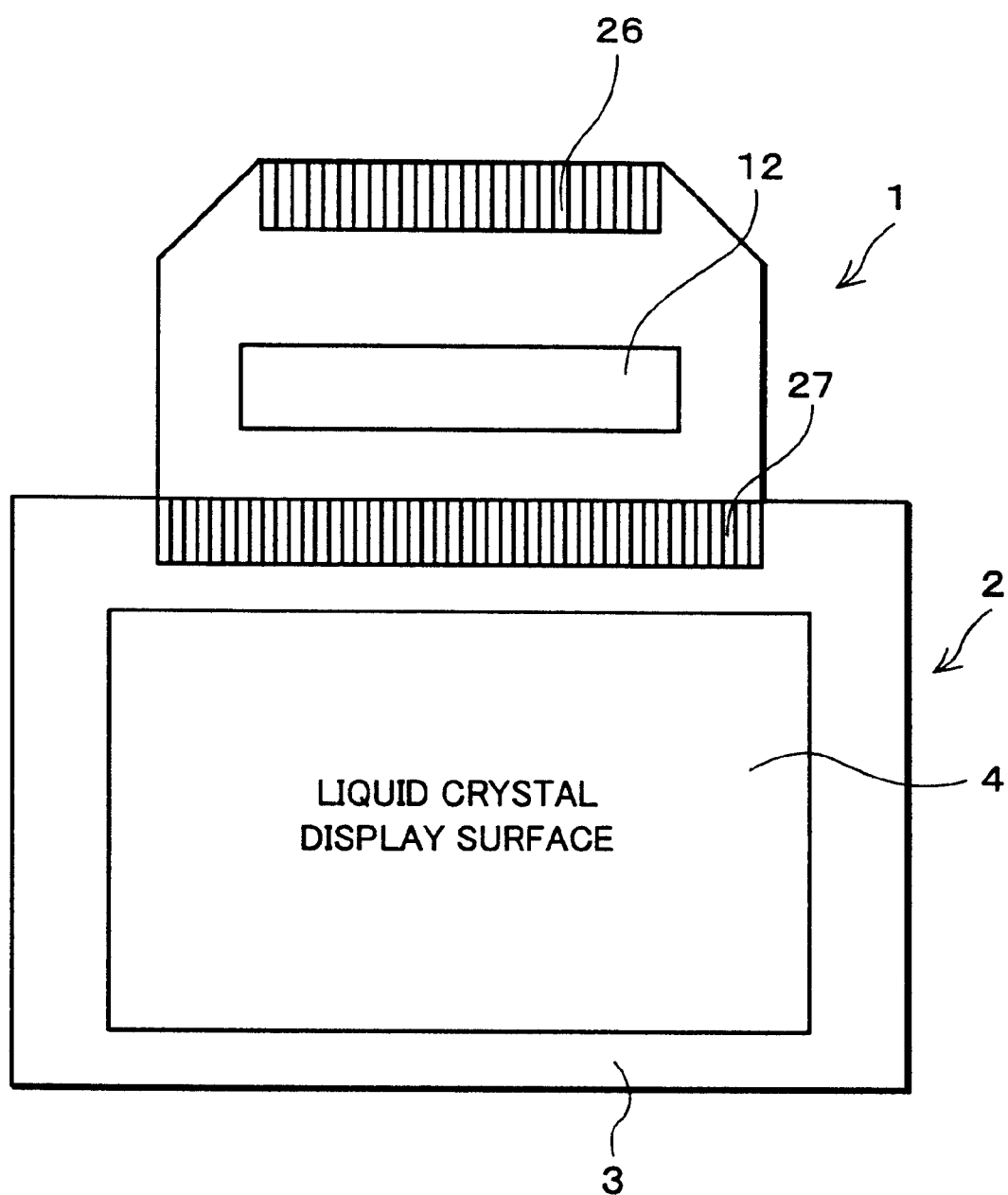
FIG. 10 is a plan view schematically showing a liquid crystal module with a semiconductor device of the present invention mounted thereon.
Figure 11:
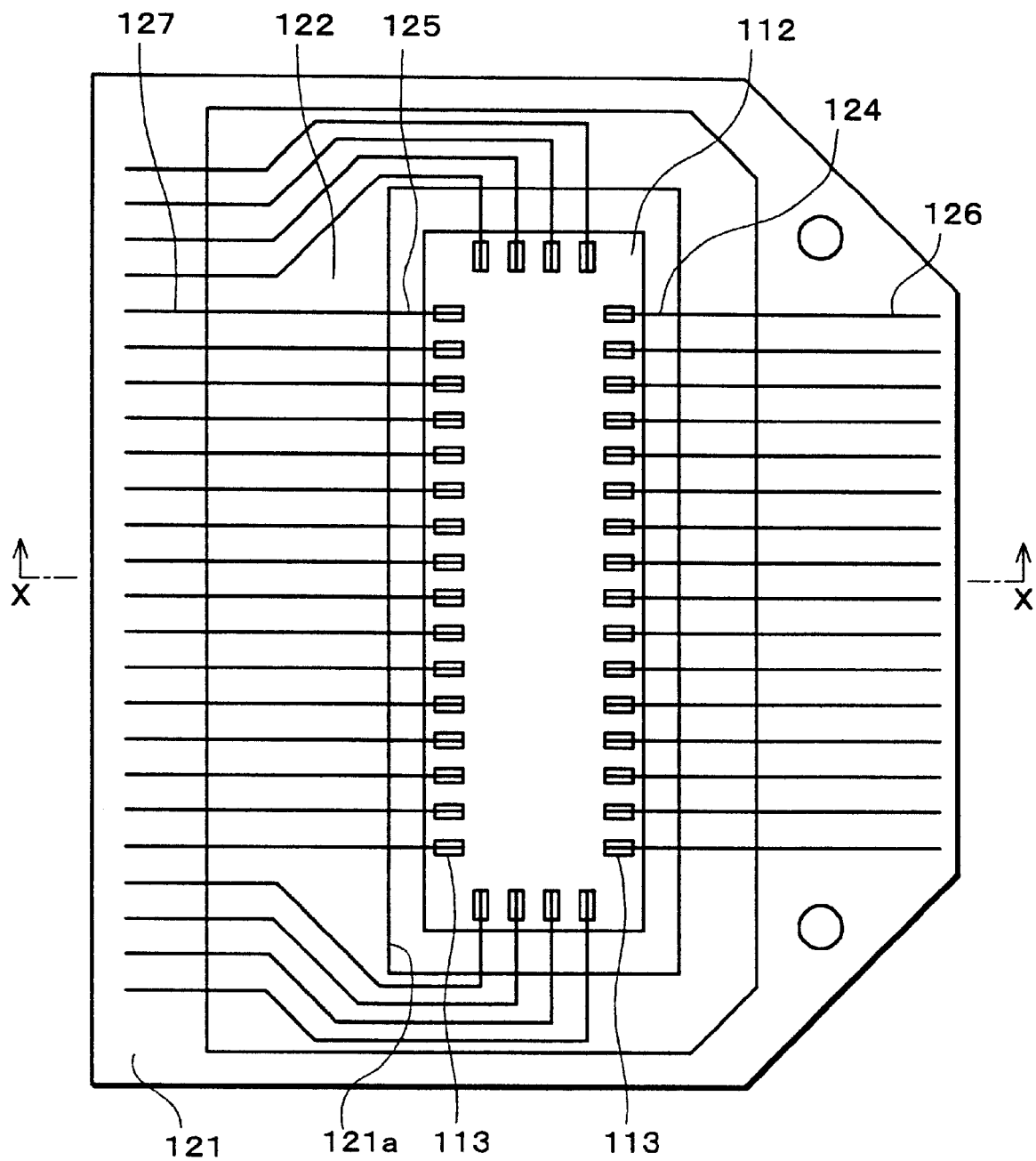
FIG. 11 is a schematic plan view of a conventional semiconductor device.

The liquid crystal module is fabricated by bonding the ACF (anisotropic conductive film) 3 with a liquid crystal panel 2 by pressure, as shown in FIG. 10, and by bonding the semiconductor device 1 of the present invention thereon after alignment, using a liquid crystal panel mounting device (not shown). Here, the outer leads 27 on the signal output side of the semiconductor device 1 is bonded with the ACF 3, and input signals from the outer leads 26 of the signal input side are supplied to the liquid crystal panel 2 via the outer leads 27, so as to drive a liquid crystal display section 4.

The bonding between the semiconductor device 1 and the ACF 3 is made, for example, under applied temperature and pressure of 200° C. and 2 MPa, which are maintained for 20 seconds.

Incidentally, even though the SRAM can be manufactured by a fine process, there are cases where it is more preferable to manufacture the segment driver and the common diver by a rough process to secure sufficient voltage resisting capability. In such a case, integration of the function of the segment and common drivers and the function of the SRAM in a single semiconductor chip necessitates the use of the rough process, which increases the chip size of the semiconductor chips. However, the present invention splits the two functions into separate semiconductor chips, which allows each semiconductor chip to be manufactured by a process (fine process or rough process) according to the function to be included in the semiconductor chip. Thus, unlike the case where two functions are included in a single semiconductor chip as in the foregoing example, the manufacturing process will not be restricted by either function of the semiconductor chips, thereby reducing the size of the entire semiconductor device.

When the two semiconductor chips are to be stacked in the semiconductor device as above, the chip width of the semiconductor chip to be bonded with the inner leads later needs to be shorter than the chip width of the semiconductor chip to be bonded with the inner leads first. This is to reduce the risk of shorting or leaking due to contact between the semiconductor chip which is bonded with the inner leads later and the inner leads.

To this end, in the semiconductor device of the present invention, the semiconductor chip width to be bonded with the inner leads later is the same or smaller than the semiconductor chip width of the semiconductor chip which was bonded with the inner leads earlier.

In view of this, the semiconductor device according to the present invention may have an arrangement wherein the chip width of the semiconductor chip which is bonded with the inner leads later is the same as or shorter than the chip width of the semiconductor chip which is bonded with the inner leads first.

In this way, because the chip width of the semiconductor chip which is bonded with the inner leads later is shorter than the semiconductor chip which is bonded with the inner leads first, the semiconductor chip bonded later will not come into contact with the inner leads of the semiconductor chip which is bonded first, thus reducing the risk of shorting or leaking. As a result, high reliability and product quality is ensured.

Further, the semiconductor device according to the present invention may have an arrangement wherein the width of the area of the semiconductor chip where each bump is formed is different between the semiconductor chip which is bonded with the inner leads first and the semiconductor chip which is bonded with the inner leads later.

In this case, the area where the bumps are formed may be at the center of the semiconductor chip, or the bumps may be formed over the entire semiconductor chip, avoiding only the area on the periphery of the semiconductor chip. This allows the total length of the wiring to be reduced by those needed for extension, thus reducing the size of the semiconductor chip and the cost of manufacturing the semiconductor device.

Further, by the arrangement wherein the area of the bumps of the semiconductor chip which is bonded with the inner leads later is within the semiconductor chip which is bonded with the inner leads first, the semiconductor chip which is bonded later can be bonded with the inner leads more freely. This is because the inner leads are within the bumps of the semiconductor chip which is bonded with the inner leads first, which prevents contact between an edge of the semiconductor chip and the inner leads in the bonding process, and reliability is improved. By placing the bumps within the semiconductor chip this way, no additional wiring for extension will be required, and the chip size of the semiconductor chips can be reduced.

Further, the semiconductor device according to the present invention may have an arrangement wherein the semiconductor chip to be bonded with the inner leads first is bonded with the inner leads by an Au-Sn bond which connects the gold bump on the semiconductor chip and the tin of the inner leads, and the semiconductor chip to be bonded with the inner leads later is bonded with the inner leads by an Au-Sn bond which connects the gold bump on the semiconductor chip and the tin of the inner leads.

The Au-Sn bond is made by the formation of an eutectic of these two metals which melt at low temperatures in a range of 300° C. to 400° C. Therefore, even when there is a variance in height of the gold bumps, melting provides the same height, and this ensures secure bonding.

That is, in the structure of TCP where two semiconductor chips are bonded with each other face to face, the semiconductor chip which is bonded with the inner leads first is bonded by the Au-Sn eutectic, and the other semiconductor chip is also bonded by the Au-Sn eutectic. In this way, even when there is a variance in height of the gold bumps, the inner leads sink into the gold bumps in a melted state, thus making stable bonding.

Further, the semiconductor device according to the present invention may have an arrangement wherein the semiconductor chip which is bonded with the inner leads first is bonded by the Au-Sn eutectic, and the other semiconductor chip is also bonded by the Au-Sn eutectic, where an epoxy adhesive is used on the Au-Sn bond.

In this case, after the tin leads penetrate into the gold bumps, the epoxy adhesive shrinks to complete bonding. Here, the epoxy adhesive is cured at 200° C., and there is only small displacement of the leads due to thermal expansion of the tape in bonding, thus realizing accurate bonding.

That is, in order to bond the inner leads with the semiconductor chip which is bonded later, an epoxy resin is applied in advance over the surface of the semiconductor chip which is bonded with the inner leads first. The semiconductor chip bonded later is then bonded with the inner leads by heating, in which process the inner leads penetrate into the bumps of this semiconductor chip. Thereafter, a temperature of around 200° C. is applied to completely cure the epoxy resin and fix the points of bonding. Further, the cured resin undergoes further thermal shrinkage when temperature returns to room temperature, thereby fixing the points of bonding further firmly.

Further, the semiconductor device according to the present invention may have an arrangement wherein an organic protecting film is formed on the semiconductor chip which is bonded with the inner leads first.

In this case, by forming the inner leads on the organic protecting film, the surface of the semiconductor chip which is bonded first is protected by the organic insulating film when bonding the inner leads with the semiconductor chip which is bonded later.

That is, the organic protecting film formed on the semiconductor chip which is bonded with the inner leads first has elasticity which can absorb damages which may be caused when bonding the semiconductor chip which is bonded later. As a result, damages to the semiconductor chips due to impact of bonding can be suppressed.

Further, the electrode bearing surface of the semiconductor chip may be provided with an insulating protecting film except the points of bonding with the inner leads.

In this case, the protecting film covers the electrodes formed on the surface of the semiconductor chip to prevent contact between the electrodes and the electrical component. This allows the use of, for example, gang bonding for bonding the electrical component and the inner leads. As a result, much less time is required to bond the two semiconductor chips, or the semiconductor chip, the electrical component, and the inner leads, thereby greatly shortening time for manufacturing the semiconductor device.

Further, since the electrical component does not come into contact with the electrodes formed on the surface of the semiconductor chip, a problem associated with unwanted contact between the semiconductor chip and the electrical component can be eliminated. As a result, reliability of the semiconductor device can be improved.

Note that, the organic resin used in the present invention preferably has flexibility and heat resistance.

Examples of such an organic protecting film include polyimide resin, epoxy resin, urethane resin, and silicon resin.

In this case, the protecting film of the semiconductor chip which is bonded with the inner leads first is made of a material which is relatively inexpensive and easily available. Particularly, polyimide has high heat resistance, and can be appreciably used as the protecting film because the resin does not melt even when the bonding temperature exceeds 500° C.

Further, the semiconductor device according to the present invention may have an arrangement wherein the thickness of the organic protecting film is set so that it is substantially the same as the height of the bumps, which is at least 1 µm.

When forming the protecting film this way, if the thickness of the protecting film exceeds the height of the bumps, the inner leads interfere with the gold bumps of the semiconductor chip which is bonded first, and this poses a problem in bonding. Further, the thickness of the protecting film less than 1 µm prohibits the protecting film to function properly, and the surface of the semiconductor chip which is bonded first may be damaged in this case.

That is, as in the foregoing arrangement, by setting the protecting film to have a thickness not less than 1 µm and to have a height substantially the same as that of the bumps, the underlying element of the protecting film will not be damaged by the semiconductor chip which is bonded with the inner leads later. As a result, reliability is improved. In addition, it is possible to solve the problem of instable bonding between the semiconductor chip which is bonded first and the inner leads, which is caused when the protecting film is thicker than the height of the bumps.

Further, the semiconductor device according to the present invention may have an arrangement wherein the inner leads are fixed on the protecting film of the semiconductor chip which is bonded with the inner leads first, so as to prevent contact between the inner leads and the surface of the semiconductor chip.

In this case, by forming the protecting film in advance on the semiconductor chip which is bonded with the inner leads first, the tips of the inner leads are protected by the protecting film. This allows bonding of the semiconductor chip which is bonded later, without damaging the surface of the semiconductor chip which is bonded with the inner leads first.

Further, the semiconductor device according to the present invention may have an arrangement wherein the inner leads project toward the center of the semiconductor chip which is bonded with the inner leads first by at least 30 $\mu$m from the bumps formed thereon, but without touching the bumps on the opposite side.

For example, when the inner leads are projecting by at least 30 $\mu$m without the provision of the protecting film on the semiconductor chip which is bonded with the inner leads first, the inner leads will be in contact with the semiconductor chip, with the result that the surface of the semiconductor chip is damaged. That is, in the currently available TCPs, when the inner leads project by 30 $\mu$m or longer, the tips of the inner leads come into contact with the surface of the semiconductor chip to damage or cause cracking on the semiconductor chip. Thus, there is a serious problem of reliability.

In contrast, as in the foregoing arrangement, by the provision of the protecting film on the surface of the semiconductor chip which is bonded with the inner leads first, the tips of the inner leads will be on the protecting film and fixed thereon even when the inner leads project by 30 $\mu$m. As a result, the surface of the semiconductor chip which is bonded with the inner leads first is protected, thus solving the problem of reliability and safely bonding the semiconductor chip which is bonded with the inner leads later.

Further, the semiconductor device according to the present invention may have an arrangement wherein the inner leads are provided on the protecting film which is formed on the semiconductor chip which is bonded first, without being bonded with the bumps of this semiconductor chip but with the bumps of the semiconductor chip which is bonded later.

In this case, there is at least one inner lead which is simply fixed on the protecting film formed on the surface of the semiconductor chip which is bonded with the inner leads first, without making contact with the bumps of this semiconductor chip. That is, this arrangement is applicable when there is an inner lead which does not need to be conducted with the semiconductor chip which is bonded with the inner leads first.

Further, the semiconductor device according to the present invention may have an arrangement wherein the inner leads project toward the center of the semiconductor chip past the bumps of the semiconductor chip, and tips of at least two such inner leads are connected.

With this arrangement, the inner leads can be connected at the same potential over a distance. That is, it is possible to adopt a structure in which the protecting film is formed on the semiconductor chip which bonded with the inner leads first, and at least two inner leads are connected to each other at their tips or middle portions above the protecting film.

In this case, conducting wiring can be provided within the inner lead wiring above the semiconductor chip, rather than through the semiconductor chip, thus reducing the chip size of the semiconductor chip. Further, the wiring using the inner leads allows the use of thicker wires for power lines or high voltage lines, thus preventing the problem of open wires which is cause by an excess current, etc.

Further, the semiconductor device according to the present invention may have an arrangement wherein there are provided inner leads, which are not connected at the tips, between the inner leads which are connected at the tips.

In the semiconductor device of this structure, the single inner leads which are not connected at the tips are provided between the inner leads which are connected at the tips, so as to effectively utilizes the area of the inner leads which are connected at the tips.

That is, the foregoing structure is applicable to the case where, for example, wires such as the power lines are provided from one end to the other end of the semiconductor chip, and input lines or output lines are provided therebetween. Further, between the inner leads which are connected at the tips, there may be provided another set of inner leads which are connected to each other.

Further, the semiconductor device according to the present invention may have an arrangement wherein the height of the bumps of the semiconductor chip which is bonded with the inner leads first is different from the height of the bumps of the semiconductor chip which is bonded with the inner leads later.

For example, the foregoing arrangement is applicable to the case where the pitch of the bumps is different between the semiconductor chip which is bonded with the inner leads first and the semiconductor chip which is bonded with the inner leads later. That is, the semiconductor device is designed such that the height of the bumps is set to be as low as about 10 $\mu$m when the bumps are provided in fine pitch, and the height of rough-pitch bumps is set to be higher than that of the fine-pitch bumps. In this way, the higher bump height allows a resin to be injected into the spacing between the bonded semiconductor chips relatively easily, and it is not required to use a low-viscosity resin.

Further, the semiconductor device according to the present invention may have an arrangement wherein at least one semiconductor chip is covered with a resin.

The semiconductor device with the bonded semiconductor chips requires a resin sealant between the semiconductor chips, for which a low-viscosity resin is needed. In this case, the thickness of the semiconductor device is reduced by optimizing the viscosity of the resin, so that the resin does not invade the rear surface of the semiconductor chip. That is, in order to reduce the thickness of the device (semiconductor device), the resin should not cover the both semiconductor chips.

Further, the semiconductor device according to the present invention may have an arrangement wherein the semiconductor chip which is bonded with the inner leads first and the semiconductor chip which is bonded with the inner leads later have different functions.

When two semiconductor chips are to be stacked, the capacity may be increased by stacking the semiconductor chips of the same function, such as the function of the SRAM or the drivers. However, by stacking the semiconductor chips of different functions, for example, the function of the SRAM and the function of the drivers, a high-performance device can be manufactured.

For example, a liquid crystal driver for portable phones is composed of the SRAM, the controller, the common driver, and the segment driver. A high-performance device can be manufactured by stacking the semiconductor chips with these functions in a single semiconductor device.

In this manner, when stacking semiconductor chips, by providing them in components, the semiconductor device can have an additional function only by replacing one of the semiconductor chips with a different semiconductor chip.

Further, the semiconductor device according to the present invention may have an arrangement wherein the inner leads of the carrier tape are Au-plated, and the bumps of the semiconductor chips are made of gold, and the plated gold on the inner leads is bonded with the gold bumps.

In this case, by the Au plating, the inner leads can be bonded with the gold bumps with the same material, which provides desirable bonding, thus improving stability of bonding.

Further, the semiconductor device according to the present invention may have an arrangement wherein an electrical component such as a chip capacitor is disposed beside the semiconductor chip which is bonded later, and stacked on the semiconductor chip which is bonded first.

As a rule, a chip capacitor is required for the integration of the liquid crystal driver, the SRAM, and the controller. Thus, by forming an electrical component such as the chip capacitor, which is provided externally from the semiconductor chip, within the semiconductor device, i.e., on the semiconductor chip which is bonded with the inner leads first, the system composed of the semiconductor chips can be made more compact.

Further, the semiconductor device according to the present invention may have an arrangement wherein lands for mounting an electrical component such as the chip capacitor are provided on the tips of the inner leads.

For example, by forming a land of 1 mm×1 mm on the tips of the inner leads, the chip capacitor can be incorporated on the land when it is needed.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device, comprising:
   a carrier tape composed of a base material with a wiring pattern;
   inner leads which project into an opening of the carrier tape and which are connected to the wiring pattern;
   a semiconductor chip which is bonded with the inner leads at the opening; and
   an electrical component which is bonded with the inner leads on the opposite side of a surface of the semiconductor chip bonded with the inner leads,
   wherein the electrical component is bonded with the inner leads at a depression which is created as a result of bonding between the semiconductor chip and the inner leads.

2. The semiconductor device as set forth in claim 1, wherein the depression is created by the inner leads which are bent in the opening in a direction toward the semiconductor chip to be bonded.

3. The semiconductor device as set forth in claim 1, wherein an insulating protecting film is provided on an electrode bearing surface of the semiconductor chip except points of bonding with the inner leads.

4. The semiconductor device as set forth in claim 1, wherein the points of bonding between the semiconductor chip and the inner leads at least partially overlap across the inner leads with points of bonding between the electrical component and the inner leads.

5. The semiconductor device as set forth in claim 1, wherein a width of the semiconductor chip is equal to or longer than a width of the electrical component.

6. The semiconductor device as set forth in claim 1, wherein the electrical component has a different function from that of the semiconductor chip.

7. The semiconductor device as set forth in claim 1, wherein the electrical component is a chip capacitor.

8. The semiconductor device as set forth in claim 1, wherein gold bumps on a semiconductor chip which is bonded with the inner leads first are bonded with tin of the inner leads, and gold bumps on a semiconductor chip which is bonded with the inner leads later are bonded with tin of the inner leads.

9. The semiconductor device as set forth in claim 8, wherein an epoxy adhesive is used for points of bonding between the gold bumps of the semiconductor chips and the inner leads.

10. The semiconductor device as set forth in claim 3, wherein the protecting film is made of an organic material.

11. The semiconductor device as set forth in claim 10, wherein the organic protecting film is made of a material which contains polyimide, epoxy, or urethane.

12. The semiconductor device as set forth in claim 10, wherein a thickness of the protecting film is set to be equal to or less than a height of bumps which are formed at at least 1 $\mu$m on the semiconductor chip.

13. The semiconductor device as set forth in claim 3, wherein the inner leads are fixed on the protecting film of a semiconductor chip which is bonded with the inner leads first.

14. The semiconductor device as set forth in claim 1, wherein the inner leads project toward a center of a semiconductor chip which is bonded with the inner leads first, said inner leads projecting by at least 30 $\mu$m from bumps formed on the semiconductor chip without touching bumps on the opposite side.

15. The semiconductor device as set forth in claim 1, wherein the inner leads exist on a protecting film which is formed on a semiconductor chip which is bonded with the inner leads first, without being bonded with bumps which are formed on this semiconductor chip, and are bonded by inner-lead bonding with bumps of a semiconductor chip which is bonded with the inner leads later.

16. The semiconductor device as set forth in claim 1, wherein the inner leads project toward a center of the semiconductor chip, and at least two of the inner leads are connected to each other on their tips.

17. The semiconductor device as set forth in claim 1, wherein a height of bumps formed on a semiconductor chip which is bonded with the inner leads first is different from a height of bumps formed on a semiconductor chip which is bonded with the inner leads later.

18. The semiconductor device as set forth in claim 1, wherein a rear surface of a semiconductor chip which is bonded with the inner leads first and/or a rear surface of a semiconductor chip which is bonded with the inner leads later are polished to have a thickness in a range of not less than 40 μm and not more than 400 μm.

19. The semiconductor device as set forth in claim 1, wherein at least one semiconductor chip is covered with a resin.

20. The semiconductor device as set forth in claim 1, wherein the inner leads are plated with gold, and bumps of the semiconductor chip are made of gold, the plated gold of the inner leads being bonded with the gold of the bumps of the semiconductor chip.

21. A semiconductor device, comprising:

a carrier tape composed of a base material with a wiring pattern;

a plurality of inner leads which project into an opening of the carrier tape and which are connected to the wiring pattern;

a first semiconductor chip which is bonded with the inner leads at the opening; and a second semiconductor chip which is bonded with the inner leads on the opposite side of a surface of the first semiconductor chip bonded with the inner leads, wherein the second semiconductor chip is bonded with the inner leads at a depression which is created as a result of bonding between the first semiconductor chip and the inner leads.

22. The semiconductor device as set forth in claim 21, wherein a chip width of the second semiconductor chip is equal to or shorter than a chip width of the first semiconductor chip.

23. The semiconductor device as set forth in claim 21, wherein an organic insulating film is provided at least on the surface of the first semiconductor chip bonded with the inner leads.

24. The semiconductor device as set forth in claim 21, wherein th e inner leads project toward a center of the semiconductor chips past bumps which are required to bond the respective semiconductor chips with the inner leads, and at least two of the inner leads are electrically connected to each other on their tips.

25. The semiconductor device as set forth in claim 21, wherein respective thicknesses of the first and second semiconductor chips are set so that a thickness when the two semiconductor chips are stacked is in a range of not less than 40 μm and not more than 400 μm.

26. The semiconductor device as set forth in claim 21, wherein a chip capacitor is provided, instead of the second semiconductor chip, above the first semiconductor chip.

27. A liquid crystal module which includes a semiconductor device which is mounted as a liquid crystal driver, said semiconductor device, including:

a carrier tape composed of a base material with a wiring pattern;

inner leads which project into an opening of the carrier tape and which are connected to the wiring pattern;

a semiconductor chip which is bonded with the inner leads at the opening; and an electrical component which is bonded with the inner leads on the opposite side of a surface of the semiconductor chip bonded with the inner leads, wherein the electrical component is bonded with the inner leads at a depression which is created as a result of bonding between the semiconductor chip and the inner leads.

* * * * *